United States Patent
Liu et al.

(10) Patent No.: US 12,451,869 B2
(45) Date of Patent: Oct. 21, 2025

(54) PHASE SHIFTER, DRIVING METHOD FOR THE PHASE SHIFTER AND ANTENNA SYSTEM

(71) Applicants: Beijing BOE Technology Development Co., Ltd., Beijing (CN); BOE TECHNOLOGY GROUP CO., LTD., Beijing (CN)

(72) Inventors: Zongmin Liu, Beijing (CN); Wei Li, Beijing (CN); Junwei Guo, Beijing (CN); Xichao Fan, Beijing (CN); Feng Qu, Beijing (CN); Biqi Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/786,213

(22) PCT Filed: Sep. 26, 2021

(86) PCT No.: PCT/CN2021/120618
§ 371 (c)(1),
(2) Date: Jun. 16, 2022

(87) PCT Pub. No.: WO2023/044847
PCT Pub. Date: Mar. 30, 2023

(65) Prior Publication Data
US 2024/0162607 A1    May 16, 2024

(51) Int. Cl.
*H03H 11/16*    (2006.01)

(52) U.S. Cl.
CPC ................ *H03H 11/16* (2013.01)

(58) Field of Classification Search
None
See application file for complete search history.

(56) References Cited

U.S. PATENT DOCUMENTS

| 10,320,411 | B1 | 6/2019 | Zhang | |
|---|---|---|---|---|
| 11,340,995 | B2* | 5/2022 | Seger, Jr. | G06F 13/105 |
| 11,545,962 | B2* | 1/2023 | Liu | H03H 11/16 |

FOREIGN PATENT DOCUMENTS

| CN | 101145783 A | 3/2008 |
|---|---|---|
| CN | 101471663 A | 7/2009 |
| CN | 107942776 A | 4/2018 |
| CN | 108631754 A | 10/2018 |
| CN | 109298080 A | 2/2019 |
| EP | 1351390 A1 | 10/2003 |
| KR | 20120071307 A | 7/2012 |

* cited by examiner

*Primary Examiner* — Cassandra F Cox
(74) *Attorney, Agent, or Firm* — HOUTTEMAN LAW LLC

(57) ABSTRACT

The present disclosure provides a phase shifter, a driving method for the phase shifter, and an antenna system, and belongs to the field of communication technologies. The present disclosure provides a phase shifter, including: a control module, a digital-to-analog conversion module and a phase shift structure; the control module is configured to generate a plurality of correction signals according to phase shift degrees of the phase shift structure; the digital-to-analog conversion module is configured to generate a driving signal according to the correction signals; and the phase shift structure is configured to shift a phase of a microwave signal passing therethrough according to the driving signal.

18 Claims, 10 Drawing Sheets

PHASE SHIFTER, DRIVING METHOD FOR THE PHASE SHIFTER AND ANTENNA SYSTEM

TECHNICAL FIELD

The present disclosure relates to the field of communication technologies, and in particular, to a phase shifter, a driving method for the phase shifter, and an antenna system.

BACKGROUND

Phased array antennas are widely used due to no need for precision moving parts of conventional mechanical scanning antennas. When a phased array antenna is used, the phased array antenna needs to be equipped with a phase shifter capable of shifting a phase of a high-frequency signal for making a beam direction of an electromagnetic wave radiated from the phased array antenna changeable. Phased array antennas adopting liquid crystal phase shifters have become a research hotspot of the phased array antennas due to their characteristics of low cost and low profile.

In practical use, there is a problem that a change in driving signal of the liquid crystal phase shifter and a change in phase shift degree of the liquid crystal phase shifter have a nonlinear relationship therebetween in a driving process of the liquid crystal phase shifter, that is, in some ranges of a driving signal of the liquid crystal phase shifter, a minor change of the driving signal may cause a relatively large change of a phase shift degree. When precision of a driving voltage is not high enough, a change of the phase shift degree in an abrupt change region is uncontrollable.

In the related art, a high-precision digital-to-analog converter is usually used to generate a high-precision driving voltage in order to solve the above technical problem. However, the applicant found that the use of the high-precision digital-to-analog converter leads to a drastic increase in cost, and a requirement of control of the phase shift degree of the liquid crystal phase shifter cannot be satisfied even if a high-precision 12-bit digital-to-analog converter is used.

SUMMARY

For at least solving one of the problems in the related art, the present disclosure provides a phase shifter, a driving method for the phase shifter and an antenna system.

In a first aspect, the present disclosure provides a phase shifter, including: a control module, a digital-to-analog conversion module and a phase shift structure; the control module is configured to generate a plurality of correction signals according to phase shift degrees of the phase shift structure; the digital-to-analog conversion module is configured to generate a driving signal according to the correction signals; and the phase shift structure is configured to shift a phase of a microwave signal passing therethrough according to the driving signal.

In some implementations, the phase shifter further includes: a data generation module configured to generate a data signal according to status data of the phase shifter; the digital-to-analog conversion module includes: a resistor string and a switch group; the resistor string is divided into a plurality of resistor sub-strings connected in series, and each resistor sub-string includes a plurality of resistors connected in series; the switch group includes a plurality of switches, and at least one resistor is connected between every two adjacent switches; and the switches are configured to electrically connect the resistor string to the phase shift structure; a voltage across each resistor sub-string is set to be a voltage difference between different correction signals; and the driving signal is set to be a sum of voltages of the plurality of resistors; and the switches are configured to transmit the driving signal to the phase shift structure under control of the data signal.

In some implementations, at least part of the resistors have different resistance values.

In some implementations, the phase shifter further includes: an operational amplifier configured to amplify the driving signal and connected to the digital-to-analog conversion module and the phase shift structure.

In some implementations, the phase shifter further includes a data generation module, a calculation module, a data conversion module and a logic control module; the logic control module is configured to generate a query signal when determining that a first data signal corresponding to a first phase shift degree of the phase shift structure does not exist; the calculation module is configured to generate a second phase shift degree which is different from the first phase shift degree by at least one phase shift period according to the query signal; the data generation module is configured to generate a second data signal according to the second phase shift degree; and a data conversion module is configured to generate the driving signal according to the second data signal.

In some implementations, the second phase shift degree is greater than the first phase shift degree, and the second phase shift degree is different from the first phase shift degree by one phase shift period.

In some implementations, the phase shifter further includes a selection module; the digital-to-analog conversion module includes a first digital-to-analog conversion submodule and a second digital-to-analog conversion submodule; a first driving signal output by the first digital-to-analog conversion submodule is less than a second driving signal output by the second digital-to-analog conversion submodule in magnitude; and resolution of the first driving signal is greater than that of the second driving signal; the control module is configured to generate the correction signals according to magnitudes of the driving signals; and the selection module is configured to turn on the first digital-to-analog conversion submodule or the second digital-to-analog conversion submodule according to the correction signals.

In some implementations, the selection module includes a first transistor and a second transistor; a control electrode of the first transistor is connected to the control module, a first electrode of the first transistor is connected to the first digital-to-analog conversion submodule, and a second electrode of the first transistor is connected to the phase shift structure; and a control electrode of the second transistor is connected to the control module, a first electrode of the second transistor is connected to the second digital-to-analog conversion submodule, and a second electrode of the second transistor is connected to the phase shift structure.

In some implementations, the selection module includes a first transistor and a second transistor; and switching characteristics of the first transistor and the second transistor are opposite; and a control electrode of the first transistor and a control electrode of the second transistor are connected to each other, and are connected to the control module; a first electrode of the first transistor is connected to the first digital-to-analog conversion submodule, and a second electrode of the second transistor is connected to the second digital-to-analog conversion submodule; and a second electrode of the first transistor and a first electrode of the second transistor are connected to each other, and are connected to the phase shift structure.

In some implementations, the control module includes one of a Microcontroller Unit (MCU), a Digital Signal Processor (DSP), an Application Specific Integrated Circuit (ASIC), or a Field Programmable Gate Array (FPGA).

In a second aspect, the present disclosure further provides a driving method for a phase shifter, including: generating a plurality of correction signals by a control module according to phase shift degrees of a phase shift structure; respectively setting the correction signals at two terminals of a resistor sub-string in a resistor string of a digital-to-analog conversion module; generating a driving signal according to voltages of a plurality of resistors in the resistor string; and driving the phase shift structure by the driving signal to perform phase shifting.

In some implementations, the driving method further includes: before respectively setting the correction signals at the two terminals of the resistor sub-string in the resistor string of the digital-to-analog conversion module, the driving method further includes calculating a corresponding relationship between a driving signal of the phase shift structure and phase shift degrees of the phase shift structure; and setting a resistance value of each resistor according to the corresponding relationship.

In some implementations, the driving method further includes: adjusting the correction signals according to the corresponding relationship.

In a third aspect, the present disclosure further provides a driving method for a phase shifter, including: determining by a logic control module that a first data signal corresponding to a first phase shift degree of the phase shifter does not exist; calculating a second phase shift degree which is different from the first phase shift degree by at least one phase shift period; generating a second data signal according to the second phase shift; generating a driving signal according to the second data signal; and driving a phase shift structure by the driving signal to perform phase shifting.

In a fourth aspect, the present disclosure further provides a driving method for a phase shifter, including: generating a correction signal by a control module according to magnitude of a driving signal; wherein the driving signal includes a first driving signal and a second driving signal, the first driving signal is a driving signal output by a first digital-to-analog conversion submodule in a digital-to-analog conversion module, and the second driving signal is a driving signal output by a second digital-to-analog conversion submodule in the digital-to-analog conversion module; and controlling, by a selection module, the first digital-to-analog conversion submodule or the second digital-to-analog conversion submodule to be turned on according to the correction signal to generate a driving signal; and driving a phase shift structure by the driving signal to perform phase shifting.

In a fifth aspect, the present disclosure further provides an antenna system, including the phase shifter described above.

DETAIL DESCRIPTION OF EMBODIMENTS

Figure 1:
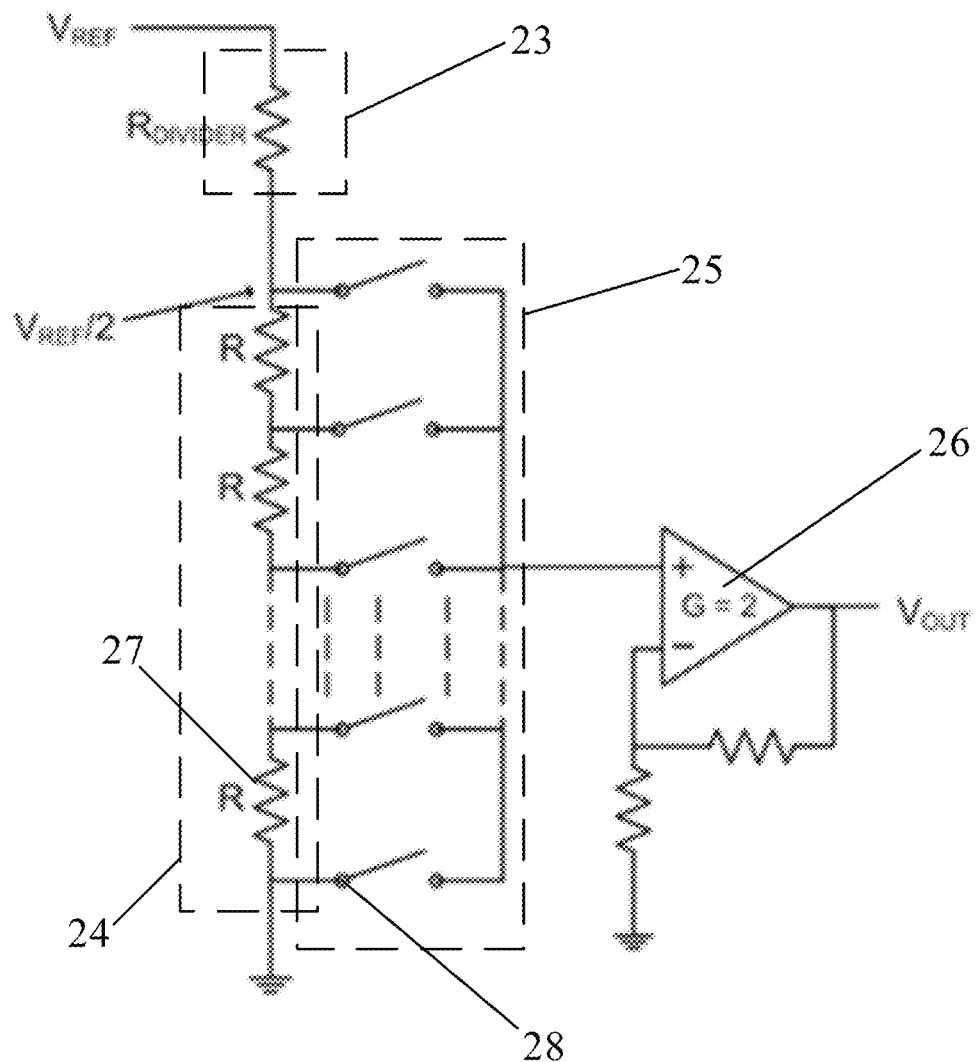
FIG. 1 is a schematic diagram of a conventional phase shift structure.

In order to enable those skilled in the art to better understand the technical solutions of the present disclosure, the present disclosure is further described in detail below with reference to the drawings and specific embodiments.

Unless otherwise defined, technical terms or scientific terms used herein should have general meanings that are understood by those of ordinary skill in the technical field of the present disclosure. The words "first", "second" and the like used herein do not denote any order, quantity or importance, but are just used to distinguish between different components. Similarly, the words "one", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Transistors adopted in an exemplary embodiment and the embodiments of the present disclosure may be thin film transistors (TFTs), field effect transistors, or other switching devices having the same characteristics. The TFTs may include oxide semiconductor thin film transistors (TFTs), amorphous silicon thin film transistors (TFTs), or polysilicon thin film transistors (TFTs). Each transistor includes a first electrode, a second electrode and a control electrode; the control electrode is used as a gate electrode of the transistor, one of the first electrode and the second electrode is used as a source electrode of the transistor, and the other one of the first electrode and the second electrode is used as a drain electrode of the transistor; and since the source electrode and the drain electrode of the transistor are symmetrical in structure, there is no difference between the source electrode and the drain electrode in terms of physical structure. In the embodiments of the present application, in order to distinguish between the transistors, in addition to that the gate electrode is described as the control electrode, the first electrode is directly described as the source electrode and the second electrode is directly described as the drain electrode.

In addition, the transistors can be divided into N-type transistors and P-type transistors according to the characteristics of the transistors. In the following exemplary embodiment and the following embodiments of the present disclosure, in a case where an N-type transistor is adopted, a first electrode is a source electrode of the N-type transistor, a second electrode is a drain electrode of the N-type transistor, and the transistor is turned on when a high level is input to a gate electrode, which is contrary to a case where a P-type transistor is adopted. It is conceivable that those skilled in the art can readily envisage, without creative work, using the P-type transistors to implement the present disclosure, so that using the P-type transistors also falls in the scope of the embodiments of the present disclosure. For example, X is an exemplary phase shifter, and includes a phase shift structure 1 and a digital-to-analog conversion module 2. The digital-to-analog conversion module 2 is configured to convert a data signal input thereto to a driving signal; and the phase shift structure 1 is configured to shift a phase of a microwave signal passing therethrough according to the driving signal.

As shown in FIG. 1, the digital-to-analog conversion module 2 includes: a voltage divider 23, a resistor string 24, a switch group 25 and an operational amplifier 26. One terminal of the voltage divider 23 is connected to a reference voltage terminal, the other terminal of the voltage divider 23 is connected to the resistor string 24, and a resistance value of the voltage divider 23 is equal to a sum of equivalent resistance values of resistors 27 in the resistor string 24; one terminal of the resistor string 24 is connected to the voltage divider 23, and the other terminal of the resistor string 24 is connected to a ground terminal, the resistor string 24 includes a plurality of the resistors 27 connected in series one by one, and the resistors 27 in the resistor string 24 have the same resistance value; the switch group 25 includes a plurality of switches 28, and at least one resistor 27 is connected between two adjacent switches 28; the switch group 25 is connected to the operational amplifier 26 and the resistor string 24; and an output terminal of the operational amplifier 26 is connected to the phase shift structure 1.

Specifically, as shown in FIG. 1, in the exemplary phase shifter, a voltage at the reference voltage terminal is Vref (Voltage Reference), that is, a reference voltage input to the digital-to-analog conversion module 2 is Vref. Since the resistance value of the voltage divider 23 is equal to the sum of the equivalent resistance values of the resistors 27 in the resistor string 24, a voltage across the resistor string 24 is Vref/2 according to Ohm's law. By providing the voltage divider 23, the input reference voltage can be effectively halved, a common mode input requirement of the operational amplifier 26 can be effectively reduced, and a manufacturing cost can be reduced while achieving good performance. The voltage across the resistor string 24 is Vref/2, the resistor string 24 includes the plurality of resistors 27 which are connected in series one by one and have the same resistance value, and the number of the resistors 27 in the exemplary phase shifter is $2^n$ (n is an integer greater than or equal to 1), so that a value of a voltage across each resistor 27 in the resistor string 24 is $Vref/2^{n+1}$.

Figure 2:
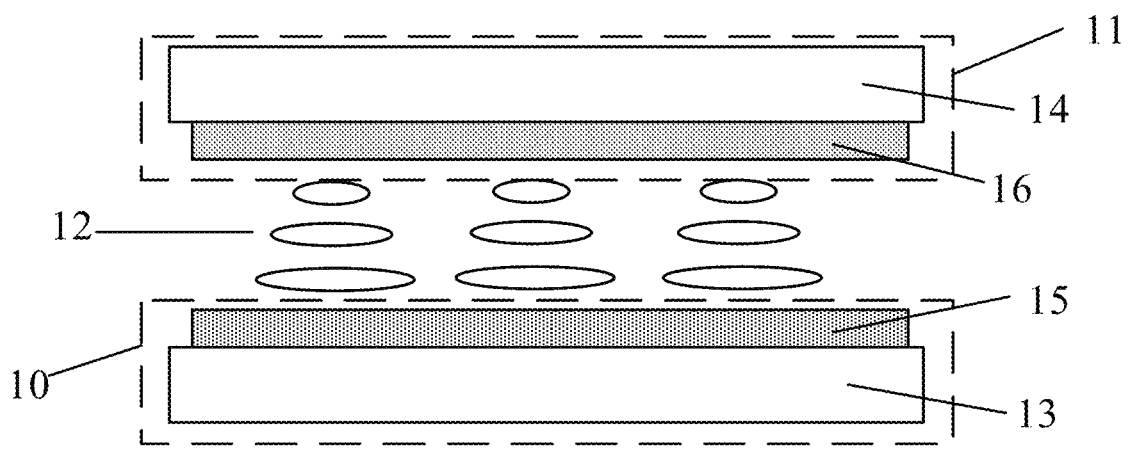
FIG. 2 is a schematic diagram of a conventional liquid crystal phase shifter.

The switch group 25 includes the plurality of switches 28, and at least one of the resistors 27 is connected between two adjacent switches 28. In the exemplary phase shifter, only one of the resistors 27 is connected between every two adjacent switches 28. As shown in FIG. 2, for each switch 28 in the switch group 25, one terminal of the switch 28 is connected to a signal line between two adjacent resistors 27, and the other terminal of the switch 28 is connected to the other switches 28 in the switch group 25. Since a data signal input to the digital-to-analog conversion module 2 controls on and off of the switches 28 in the switch group 25, it is possible to control, at one moment, only one switch 28 in the switch group 25 to be switched on and all the other switches 28 to be switched off according to the input data signal. At that moment, an output voltage of the switch group 25 is a sum of voltages of the resistors 27 between the ground terminal and the switch 28 which is switched on. Since the number of bits of the data signal is n, the data signal is a digital signal in a range from 0 to $2^n-1$. Therefore, by changing the input data signal in the above range, a switch 28 corresponding to the data signal is controlled to be switched on or switched off, so as to output an output voltage corresponding to the input data signal. The output voltage is amplified by the operational amplifier 26 to obtain a driving signal, and the driving signal corresponding to the data signal is output from the output terminal of the operational amplifier 26. Thus, the digital-to-analog converter completes conversion of the input data signal to the driving signal.

As shown in FIG. 2, the exemplary phase shifter further includes the phase shift structure 1. In the exemplary phase shifter, the phase shift structure 1 is a liquid crystal phase shifter. The exemplary liquid crystal phase shifter includes a first substrate 10 and a second substrate 11, which are disposed opposite to each other, and a liquid crystal layer 12 between the first substrate 10 and the second substrate 11. The first substrate 10 includes: a first base 13, and a first electrode 15 on a side of the first base 13 close to the liquid crystal layer 12. The second substrate 11 includes: a second base 14, and a second electrode 16 on a side of the second base 14 close to the liquid crystal layer 12. An electric field is generated between the first electrode 15 and the second electrode 16 after the first electrode 15 and the second electrode 16 are applied with voltages, so that liquid crystal molecules in the liquid crystal layer 12 can be deflected to change a dielectric constant of the liquid crystal layer 12, thereby changing a phase of a microwave signal transmitted to the liquid crystal layer 12.

When a corresponding relationship between a driving voltage of the liquid crystal phase shifter and a phase shift degree of the liquid crystal phase shifter is measured with a vector network analyzer, it is found that there is a nonlinear relationship between the driving signal and the phase shift degree in a driving process of the liquid crystal phase shifter. That is to say, for some driving signals in a certain range, when the driving signal is greatly changed, the phase shift degree is almost unchanged; and for some driving signals in a certain range, a minor change of the driving signal may cause a relatively large change of the phase shift degree; and for some driving signals in a certain range, the phase shift degree is gradually increased with a continuous increase of the driving signal.

In practical applications, the applicant found that, since the output driving signal is obtained by amplifying a sum of the voltages of some resistors 27 in the resistor string 24 by the operational amplifier 26 and the voltage of each resistor 27 in the resistor string 24 is $Vref/2^{n+1}$, the driving signal output by the digital-to-analog conversion module 2 are a group of discrete signals with an interval of $Vref/2^{n+1}$. The phase shift degree cannot be controlled because there is the nonlinear relationship between the driving signal and the phase shift degree in the driving process of the liquid crystal phase shifter, that is, a minor change of the driving signal in some ranges may cause a relatively large change of the phase shift degree, and a relatively large change of the phase shift degree may be caused even if the driving signal is changed with a minimum interval of $Vref/2^{n+1}$, causing uncontrollable phase shift degree.

In view of some problems in the related art, the applicant sets forth some improvements to the related art.

Figure 3:
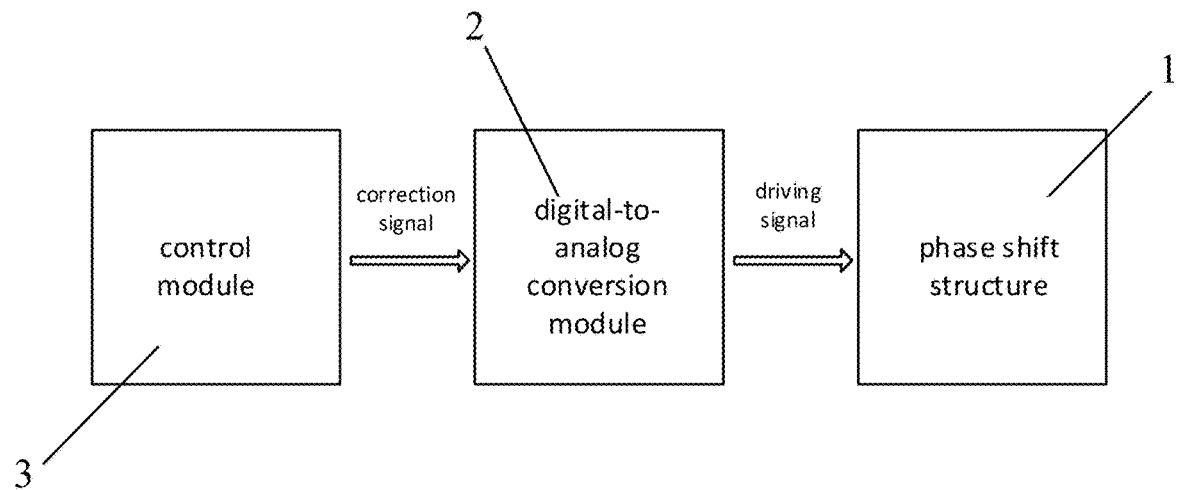
FIG. 3 is a schematic diagram illustrating a connection relationship according to an embodiment of the present disclosure.

In a first aspect, as shown in FIG. 3, the present disclosure provides a phase shifter, which includes a control module 3, a digital-to-analog conversion module 2, and a phase shift structure 1. The control module 3 is configured to generate a plurality of correction signals according to phase shift degrees of the phase shift structure 1; the digital-to-analog conversion module 2 is configured to generate a driving signal according to the correction signals; and the phase shift structure 1 is configured to shift a phase of a microwave signal passing therethrough according to the driving signal.

It should be noted that the control module 3 may specifically generate the plurality of correction signals according to a corresponding relationship between the phase shift degrees and the driving signal in the embodiments of the present disclosure. The corresponding relationship between the phase shift degrees and the driving signal of the phase shift structure 1 can be obtained by measuring the driving signal and the phase shift degree of the phase shift structure 1 in the phase shifter with a vector network analyzer, and the corresponding relationship may be a comparison table of the driving signal and the phase shift degrees, or a computable function expression, or a corresponding relationship curve 5. In the embodiment of the present disclosure, the correction signals may be used to correct the driving signal output by the digital-to-analog conversion module 2, so as to change the driving signal output by the digital-to-analog conversion module 2; the correction signals may also be used as control signals to control an operating state of the digital-to-analog conversion module 2 and generate the driving signal output by the digital-to-analog conversion module 2 by changing the operating state of the digital-to-analog conversion module 2. In the embodiment, the digital-to-analog conversion module 2 is configured to generate the driving signal according to the correction signals. A data signal is a digital signal, such as 10001001; and the driving signal is an analog signal, such as 3.3V. The phase shift structure 1 shifts the phase of the microwave signal passing therethrough according to the analog signal generated by the digital-to-analog conversion module, and the phase shift structure 1 is a liquid crystal phase shifter. The liquid crystal phase shifter includes a data electrode and a reference electrode, which are disposed on two opposite substrates of the liquid crystal phase shifter. In the embodiment of the present disclosure, the reference electrode of the liquid crystal phase shifter is grounded, the data electrode is connected to a data conversion device, and a potential of the data electrode is the driving signal output by the digital-to-analog conversion module, so that a voltage across the two substrates of the liquid crystal phase shifter is a voltage of the driving signal, and the voltage drives liquid crystal molecules in a liquid crystal layer 12 between the substrates of the liquid crystal phase shifter to physically rotate to change a dielectric constant of the liquid crystal phase shifter, and the phase of the microwave signal passing through the liquid crystal phase shifter is changed due to the change of the dielectric constant of the liquid crystal phase shifter. Thus, the liquid crystal phase shifter completes phase shifting of the microwave signal passing therethrough.

In this way, since the driving signal generated by the digital-to-analog conversion module 2 is generated according to the correction signals in the embodiment of the present disclosure, the driving signal generated by the digital-to-analog conversion module 2 can be changed through the correction signals, so as to change the phase shift degrees of the phase shift structure 1. Since the phase shift degrees of the phase shifter are the changed phase shift degree of the phase shift structure 1, the corresponding relationship between the driving signal of the phase shifter and the phase shift degrees of the phase shifter can be changed accordingly. By adjusting the correction signals, a change of the phase shift degrees of the phase shifter with the change of the driving signal of the phase shifter can be made controllable in any range of the driving signal of the phase shifter.

Figure 4:
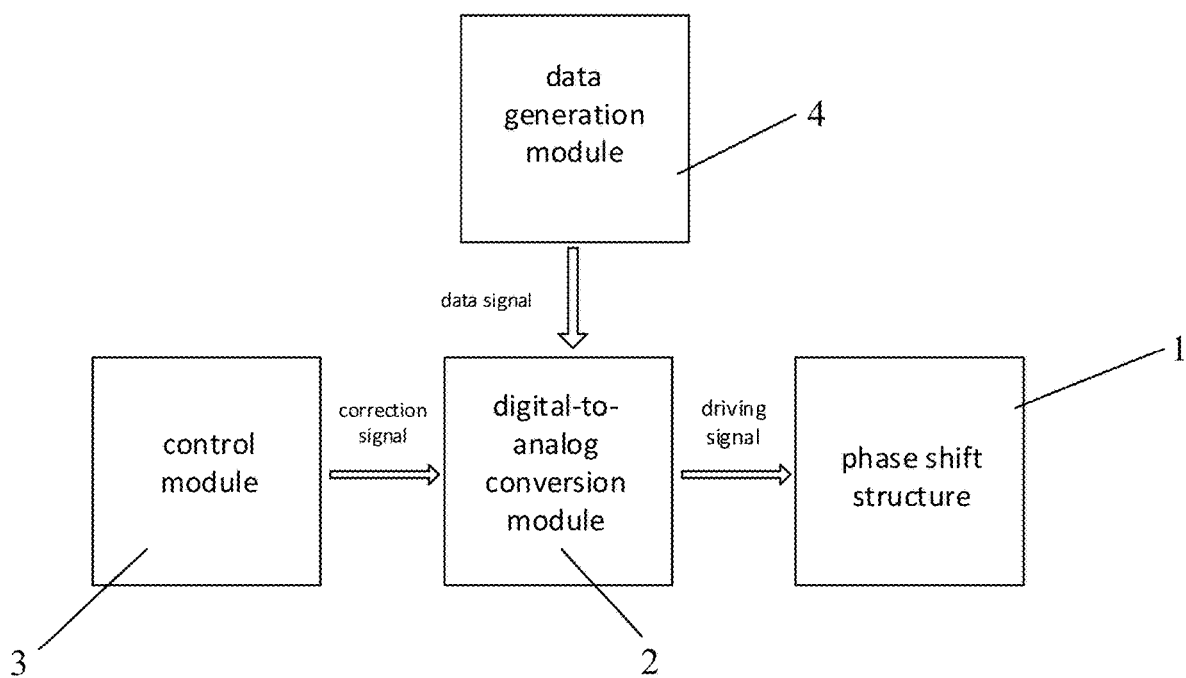
FIG. 4 is a schematic diagram illustrating another connection relationship according to an embodiment of the present disclosure.

In some implementations, as shown in FIG. 4, the phase shifter according to the embodiment of the present disclosure further includes: a data generation module 4 configured to generate a data signal. The digital-to-analog conversion module 2 includes: a resistor string 24 and a switch group 25; the resistor string 24 is divided into a plurality of resistor sub-strings 29 connected in series, and each resistor sub-string 29 includes a plurality of resistors 27 connected in series; the switch group 25 includes a plurality of switches 28, and at least one resistor 27 is connected between every two adjacent switches 28; the switches 28 are configured to electrically connect the resistor string 24 to the phase shift structure 1; a voltage across each resistor sub-string 29 is set to be a voltage difference between different correction signals; the driving signal is set to be a sum of voltages of the plurality of resistors 27; and the switches 28 are configured to transmit the driving signal to the phase shift structure 1 under the control of the data signal.

Figure 5:
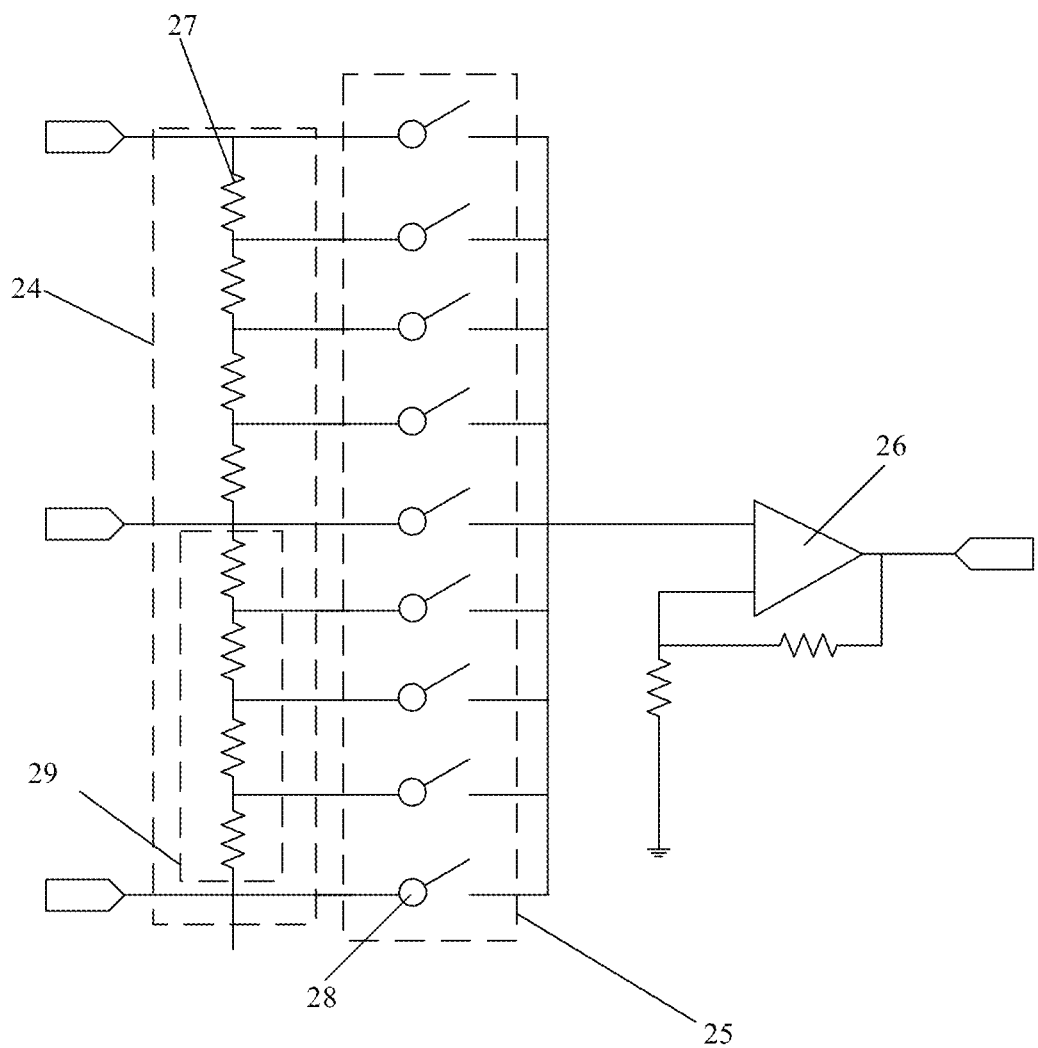
FIG. 5 is a circuit diagram of a digital-to-analog conversion module according to an embodiment of the present disclosure.

In the present embodiment, as shown in FIG. 5 which is a schematic diagram of a part of the resistor string 24, two resistor sub-strings 29 composed of 8 resistors 27 are merely taken as an example for the description of the embodiment of the present disclosure. It should be noted that the resistor string 24 and the resistor sub-strings 29 in the embodiment of the present disclosure may include hundreds of resistors, for example, the resistor string 24 includes 1000 resistors 27, and each resistor sub-string 29 includes 100 resistors 27.

The data generation module 4 in the embodiment of the present disclosure is configured to generate the data signal according to status data of the phase shifter. For example, the phase shifter may be used in a satellite system, and thus the status data of the phase shifter may be status data of a satellite. A data signal needed by the phase shifter is calculated according to the status data of the satellite. The digital-to-analog conversion module 2 in the embodiment of the present disclosure includes the resistor string 24 and the switch group 25, as shown in FIG. 5, the resistor string 24 is composed of the plurality of resistor sub-strings 29 connected in series, and each resistor sub-string 29 is composed of the plurality of resistors 27 connected in series. The voltage across the resistor sub-string 29 is set to be the voltage difference between the different correction signals. Specifically, a resistor sub-string 29 is connected to another resistor sub-string 29 adjacent thereto through a connection line which is provided a lead connected to the control module 3, and the control module 3 applies the correction signals to two terminals of the resistor sub-string 29 through the lead. It can be known according to a voltage division law that a voltage value of each resistor 27 in the resistor sub-string 29 is determined by a resistance value of each resistor 27 and the voltage difference between the correction signals at the two terminals of the resistor sub-string 29. Therefore, by controlling voltage values of the correction signals, the voltage value of each resistor 27 in the resistor string 24, which may determine a voltage value of a driving signal to be output, may be controlled, thus achieving changing the driving signal generated by the digital-to-analog conversion module 2 by the correction signals.

In the embodiment of the present disclosure, the driving signal is the sum of the voltages of the plurality of resistors 27 in the resistor string 24. As shown in FIG. 5, the digital-to-analog conversion module 2 further includes the switch group 25 including the plurality of switches 28 configured to electrically connect the resistor string 24 to the phase shift structure 1. At least one resistor 27 is connected between every two adjacent switches 28. In the embodiment of the present disclosure, only one resistor 27 is connected between two adjacent switches 28, in which case the switches 28 are configured to output the driving signal of the resistor string 24 to the phase shift structure 1 under the control of the data signal. Specifically, one terminal of each switch 28 is connected to a connection line between two adjacent resistors 27, and the other terminal of each switch 28 is connected together to serve as the output terminal of the digital-to-analog conversion module 2. With each switch 28 connected to the connection line between two adjacent resistors 27, the resistors 27 connected in series to form the resistor sub-strings 29, and voltages at two terminals of each resistor sub-string 29 being different correction signals, according to the voltage division law, when a switch 28 is switched on, a voltage on the switch 28 is a sum of voltages of all the resistors 27 that are connected in parallel with the switch group 25, and such voltage on the switch 28 is the driving signal. Since the switches 28 are configured to be switched on or switched off under the control of the data signal, a switch 28 which is switched on under the control of the data signal outputs the driving signal and transmits the driving signal to the phase shift structure 1.

Figure 6:
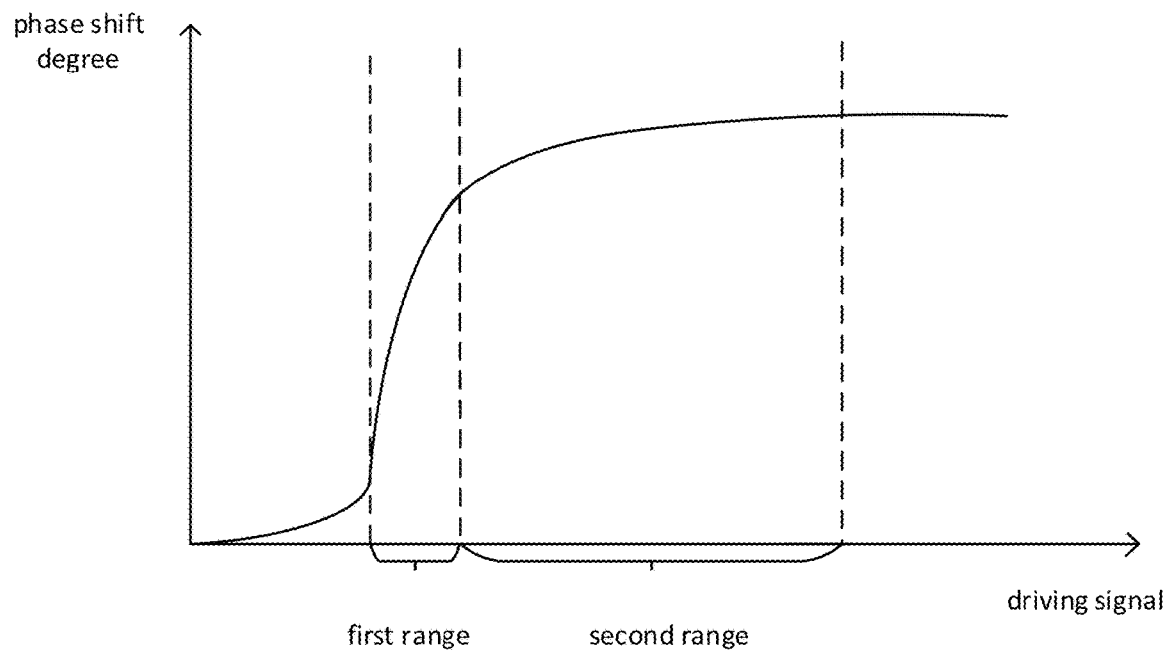
FIG. 6 is a schematic diagram illustrating a corresponding relationship between a driving signal of a phase shift structure and a phase shift degree of the phase shift structure according to an embodiment of the present disclosure.

In the embodiment of the present disclosure, the plurality of correction signals may be set in advance to allow the voltage of each resistor 27 in the resistor string 24 in the digital-to-analog converter to be obtained according to the correction signals and the resistance value of each resistor 27. Therefore, the driving signal of the phase shift structure 1 may be changed by controlling voltages of the correction signals, so that the driving signal may meet a requirement of control of the phase shift degrees. In the embodiment of the present disclosure, the correction signals may be obtained by drawing the corresponding relationship curve 5 between the driving signal of the phase shift structure 1 and the phase shift degree of the phase shift structure 1, that is, i.e., between the driving signal of the liquid crystal phase shifter and the phase shift degree of the liquid crystal phase shifter, as shown in FIG. 6. A correction curve satisfying the requirement of the control of the phase shift degrees of the liquid crystal phase shifter is calculated according to the corresponding relationship curve 5, and preferably, the curve is an approximately linear curve when the driving voltage falls in some ranges. Some points having a linear relationship may be selected from the approximately linear curve, and driving voltages of the points are used as anchor voltages of the correction curve. The anchor voltages are input to the digital-to-analog conversion module 2 as the correction signals by the control module 3, so as to make the curve drawn according to the corresponding relationship between the phase shift degrees of the phase shifter and the driving signal of the phase shifter to be the correction curve, thereby achieving control of the phase shift degree of the phase shifter.

In this way, the control of the phase shift degree of the phase shifter can be achieved without using a high-precision digital-to-analog conversion module 2, so that the phase shifter can produce a good drive effect. Moreover, the digital-to-analog conversion module 2 is simple in structure, which can produce an effect of reducing complexity and cost of manufacturing and design.

In some implementations, the control module 3 is one of a Microcontroller Unit (MCU), a Digital Signal Processor (DSP), an Application Specific Integrated Circuit (ASIC), or a Field Programmable Gate Array (FPGA). In this way, the correction signals may be implemented by means of programming, so that generation of the correction signals is simple and easy to adjust, which allows the voltage values of the correction signals to be adjusted according to an actual effect of the correction curve, thereby achieving better controllability of the phase shift degree of the phase shifter.

In some implementations, at least part of the resistors 27 in the resistor string 24 have different resistance values. The output driving signal is the sum of the voltages of the plurality of resistors 27, and the voltage across the resistor 27 is determined by the resistance value of the resistor 27 and the voltage difference between the correction signals at the two terminals of the resistor sub-string 29 where the resistor 27 is located, so that the driving signal output by the digital-to-analog converter is a group of discrete signals at an interval equal to the voltage of each resistor 27 therebetween. With the resistance values of at least part of the resistors 27 being different, the driving signal output by the digital-to-analog conversion module 2 is a group of nonlinear discrete signals. Due to some problems of a manufacturing process of the liquid crystal phase shifter and some inherent problems of a liquid crystal material, slopes of the drawn corresponding relationship curve 5 of the driving signal of the liquid crystal phase shifter and the phase shift degree of the liquid crystal phase shifter are inconsistent. By setting the driving signal output by the digital-to-analog conversion module 2 to be the nonlinear discrete signals, and enabling the digital-to-analog converter to output a specific driving signal to the liquid crystal phase shifter through calculation of the resistance values, the change of the phase shift degree of the phase shifter are made gentler, thereby achieving the controllability of the phase shift degree of the phase shifter.

In some implementations, as shown in FIG. 5, the phase shifter further includes an operational amplifier 26 configured to amplify the driving signal and connected to the digital-to-analog conversion module 2 and the phase shift structure 1. In the present embodiment, one terminal of the operational amplifier 26 is connected to the output terminal of the digital-to-analog conversion module 2, and an output terminal of the operational amplifier 26 is connected to the phase shift structure 1. As shown in FIG. 5, the operational amplifier 26 is further connected to two resistors 27, and amplifies and buffers the driving signal output by the digital-to-analog conversion module 2 according to resistance values of the two resistors 27. In this way, quality of the driving signal output from the digital-to-analog conversion module 2 to the phase shift structure 1 is higher, and the controllability of the phase shift degree of the phase shifter is better.

In some implementations, the phase shifter in the embodiment of the present disclosure further includes a data generation module 4, a calculation module, a data conversion module and a logic control module; the logic control module is configured to generate a query signal when determining that a first data signal corresponding to a first phase shift degree of the phase shift structure 1 does not exist; the calculation module is configured to generate a second phase shift degree which is different from the first phase shift degree by at least one phase shift period according to the query signal; the data generation module 4 is configured to generate a second data signal according to the second phase shift degree; and the data conversion module is configured to generate a driving signal according to the second data signal.

In the present embodiment, the data generation module 4 is configured to generate a digitized data signal, and the data signal is output as a driving signal by the digital-to-analog conversion module 2 to drive the phase shift structure 1. The logic control module is configured to determine whether the first data signal corresponding to the first phase shift degree of the phase shift structure 1 exists according to the corresponding relationship between the driving signal of the phase shift structure 1 and the phase shift degree of the phase shift structure 1. Specifically, since the driving signal output by the digital-to-analog conversion module 2 is a group of discrete signals at a certain interval therebetween, a case where the phase shifter does not have a data signal corresponding to the first phase shift degree exists because the phase shifter is limited by a minimum interval in the driving signal. For example, in a case where the first phase shift degree is 62.000° and the minimum interval corresponding to the phase shifter is 0.004V, two available phase shift degrees which are closest to the first phase shift degree and have data signals corresponding thereto are 50.000° and 70.000°, respectively, and the data signals corresponding to the two phase shift degrees are 0101011011 and 0101011100 respectively according to the corresponding relationship. Apparently, in such case, no data signal corresponding to the first phase shift degree exists. The logic control module generates the query signal when determining that no first data signal corresponding to the first phase shift degree exists. The calculation module calculates the second phase shift degree which is different from the first phase shift degree by at least one phase shift period according to the query signal. In the embodiment, one phase shift period of the phase shifter is 360°, and the calculation module calculates the second phase shift degree according to the phase shift period, for example, the second phase shift degree is 422.000°. Since a value of the second phase shift degree is greater than that of the first phase shift degree and the microwave signal has periodicity, the second phase shift degree and the first phase shift degree actually have the same phase shifting effect on the microwave signal. Due to the corresponding relationship of the phase shift structure 1, larger phase shift degrees are easier to be controlled, that is, there is a second data signal corresponding to the second phase shift degree. The data conversion module generates the driving signal according to the second data signal.

In such case, on the basis of using the correction signals, the output driving signal is further adjusted without making a large adjustment to the structure of the existing phase shifter, the controllability of the phase shift degree of the phase shifter is further improved.

In some implementations, the second phase shift degree is greater than the first phase shift degree by one phase shift period. In the embodiment, since the phase shift degree is almost unchanged with the change of the driving signal in a range of the driving signal corresponding to the second phase shift degree with a smaller value, setting the second phase shift degree to be greater than the first phase shift degree is preferable. Moreover, due to limitation of a spatial size of the phase shift structure 1, a reserved margin of the phase shift degree is limited and is generally 450°, so that setting the second phase shift degree to be different from the first phase shift degree by one phase shift period is preferable.

In some implementations, the phase shifter further includes a selection module 6; the digital-to-analog conversion module 2 includes a first digital-to-analog conversion submodule 21 and a second digital-to-analog conversion submodule 22; a first driving signal output by the first digital-to-analog conversion submodule 21 is less than a second driving signal output by the second digital-to-analog conversion submodule 22 in magnitude; resolution of the first driving signal is greater than that of the second driving signal. The control module 3 is configured to generate a correction signal according to magnitude of the first driving signal and magnitude of the second driving signal, and the selection module 6 is configured to turn on the first digital-to-analog conversion submodule 21 or the second digital-to-analog conversion submodule 22 according to the correction signal.

Figure 7:
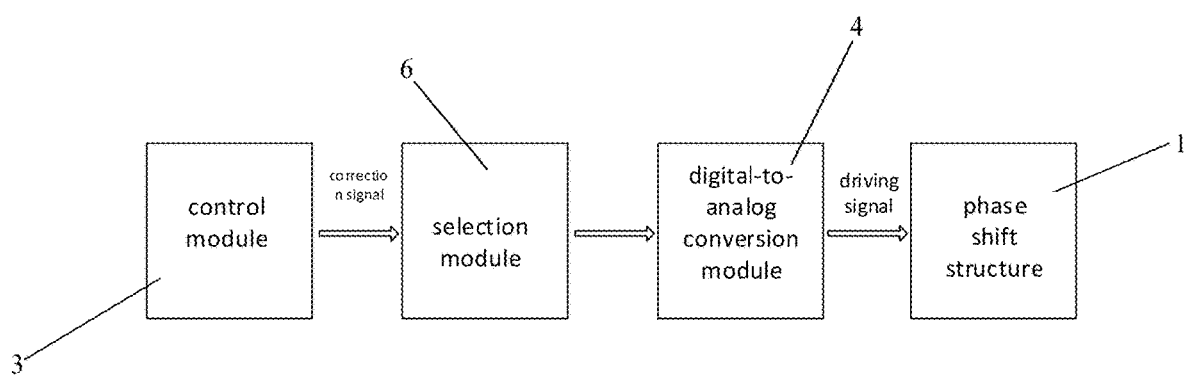
FIG. 7 is a schematic diagram illustrating another connection relationship according to an embodiment of the present disclosure.

In the embodiment, as shown in FIG. 7, the control module 3 generates the correction signal according to the magnitude of the driving signal. Due to the corresponding relationship between the driving signal of the phase shift structure 1 and the phase shift degree of the phase shift structure 1, when the driving signal is in a first range, a minor change of the driving signal of the phase shift structure 1 may cause a relatively large change of the phase shift degree, and the relatively large change of the phase shift degree may still occur even if the driving signal is changed at the minimum interval of $Vref/2^{n+1}$, which makes the phase shift degree uncontrollable; when the driving signal is in a second range, a minor change of the driving signal may cause a slow change of the phase shift degree, and the phase shift degree is controllable if the driving signal is changed at the minimum interval of $Vref/2^{n+1}$. Vref is a reference voltage of the digital-to-analog conversion module 2, n is the number of bits of a data signal input to the digital-to-analog conversion module 2, n is a positive integer greater than or equal to 2, and a voltage in the first range is less than a voltage in the second range. Therefore, the control module 3 may first determine the magnitude of a driving signal to be input, and then generate a correction signal according to whether the driving signal is in the first range or the second range, in which case the correction signal serves as a control signal to control operation of the selection module 6.

The digital-to-analog conversion module 2 includes the first digital-to-analog conversion submodule 21 and the second digital-to-analog conversion submodule 22, and the resolution of the signal output by the first digital-to-analog conversion submodule 21 is greater than that of the signal output by the second digital-to-analog conversion submodule 22. Under the control of the correction signal, when a driving signal needed by the phase shift structure 1 is in the first range, the selection module 6 controls the first digital-to-analog conversion submodule 21 to be turned on to operate. Since a voltage range of the first range is relatively narrow, magnitude of the reference voltage Vref may be reduced. Due to the greater resolution of the first digital-to-analog conversion submodule 21, the minimum interval of the driving signal in the first range may be greatly reduced. Therefore, the phase shift degree is controllable when the driving signal is changed at the minimum interval of Vref/$2^{n+1}$.

Meanwhile, when the control module 3 determines that the driving signal is in the second range, the correction signal controls the selection module 6 to control the second digital-to-analog conversion submodule 22 to be turned on to operate. Since a minor change of the driving signal in the second range may cause a slow change of the phase shift degree, the controllability of the phase shift degree may not be significantly affected even if the second digital-to-analog conversion submodule 22 with the lower resolution is used. Moreover, a manufacturing cost of the phase shifter may be greatly reduced.

In the embodiment, by providing the selection module 6 to selectively turn on the first digital-to-analog conversion submodule 21 or the second digital-to-analog conversion submodule 22, the manufacturing cost of the phase shifter is reduced while the control of the phase shift degree of the phase shifter is achieved. Moreover, the first digital-to-analog conversion submodule 21 and the second digital-to-analog conversion submodule 22 may be directly selected from mature digital-to-analog converters, thereby improving reliability of the phase shifter.

Figure 8:
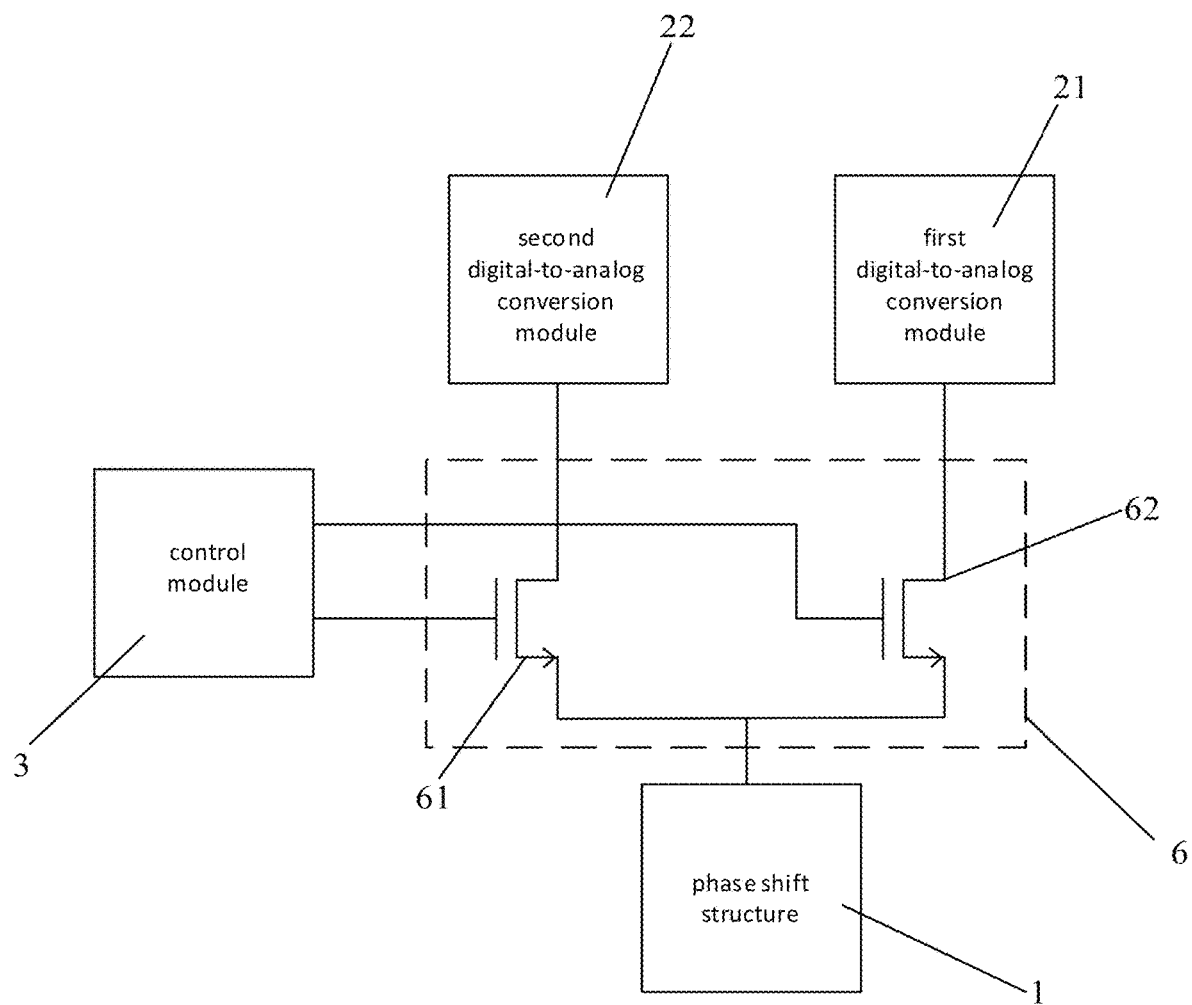
FIG. 8 is a schematic diagram illustrating still another connection relationship according to an embodiment of the present disclosure.

In some implementations, as shown in FIG. 8, the selection module 6 in the phase shifter includes a first transistor 61 and a second transistor 62; a control electrode of the first transistor 61 is connected to the control module 3, a first electrode of the first transistor 61 is connected to the first digital-to-analog conversion submodule 21, and a second electrode of the first transistor 61 is connected to the phase shift structure 1; and a control electrode of the second transistor 62 is connected to the control module 3, a first electrode of the second transistor 62 is connected to the second digital-to-analog conversion submodule 22, and a second electrode of the second transistor 62 is connected to the phase shift structure 1.

In this way, the control electrode of the first transistor 61 and the control electrode of the second transistor 62 are respectively connected to the control module 3 through two control lines, the control module 3 outputs the correction signal to only one control line at one moment to control the first transistor 61 or the second transistor 62 to be turned on, the transistor which is turned on connects the first digital-to-analog conversion submodule 21 connected thereto or the second digital-to-analog conversion submodule 22 connected thereto to the phase shift structure 1, and the first digital-to-analog conversion submodule 21 or the second digital-to-analog conversion submodule 22 transmits the generated driving signal to the phase shift structure 1 to allow the phase shift structure to complete phase shifting. The selection module 6 such configured is simple in structure and is easy to manufacture.

Figure 9:
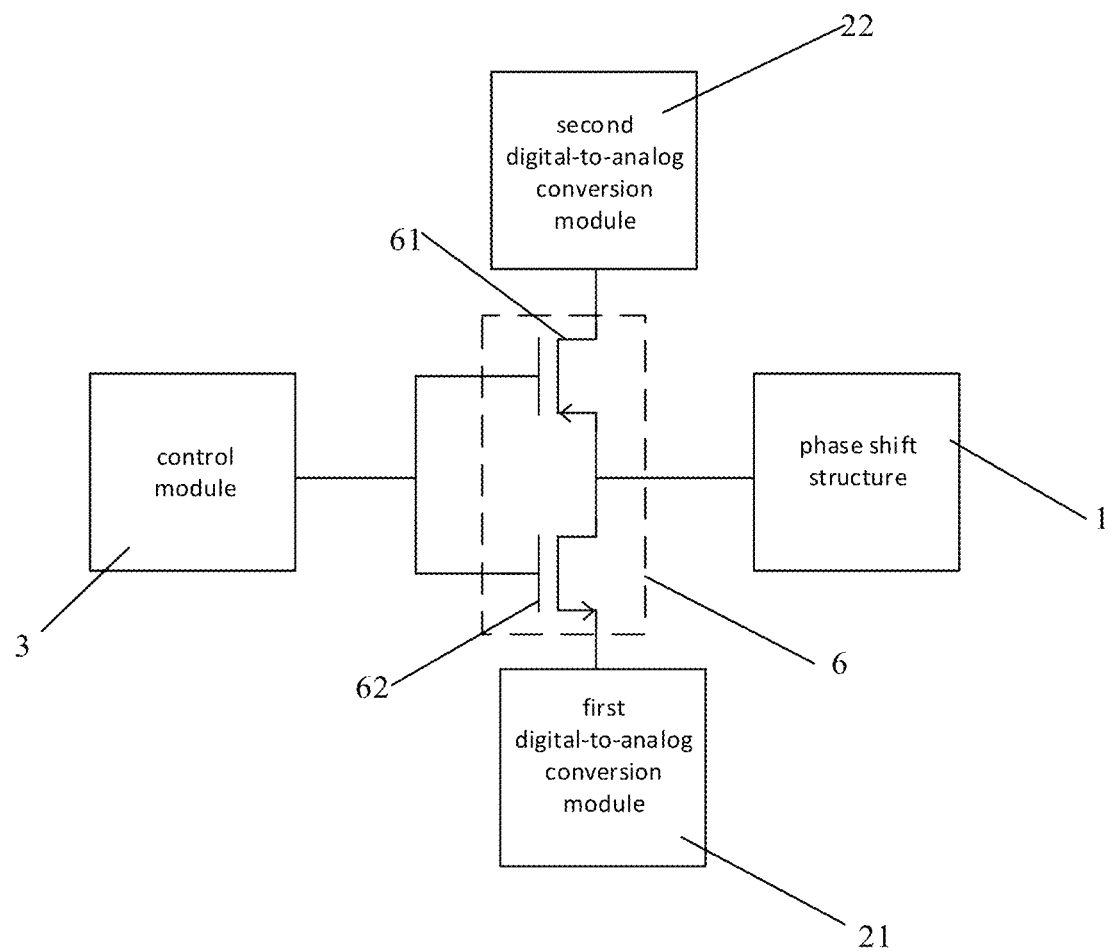
FIG. 9 is a schematic diagram illustrating yet another connection relationship according to an embodiment of the present disclosure.

In some implementations, as shown in FIG. 9, the selection module 6 in the phase shifter includes the first transistor 61 and the second transistor 62; switching characteristics of the first transistor 61 and the second transistor 62 are opposite; the control electrode of the first transistor 61 and the control electrode of the second transistor 62 are connected to each other, and are connected to the control module 3; the first electrode of the first transistor 61 is connected to the first digital-to-analog conversion submodule 21, and the second electrode of the second transistor 62 is connected to the second digital-to-analog conversion submodule 22; and the second electrode of the first transistor 61 and the first electrode of the second transistor 62 are connected to each other, and are connected to the phase shift structure 1.

In this way, due to the opposite switching characteristics of the first transistor 61 and the second transistor 62, the control electrodes of the first transistor 61 and the second transistor 62 are connected to the control module 3 through one same control line. The control module 3 controls the first transistor 61 or the second transistor 62 to be turned on by controlling magnitude of the correction signal, the transistor which is turned on connects the first digital-to-analog conversion submodule 21 connected thereto or the second digital-to-analog conversion submodule 22 connected thereto to the phase shift structure 1, and the first digital-to-analog conversion submodule 21 or the second digital-to-analog conversion submodule 22 transmits the generated driving signal to the phase shift structure 1 to allow the phase shift structure to complete phase shifting. In the embodiment, the first transistor 61 is an N-type transistor and is turned on when the correction signal is at a high level, and the second transistor 62 is a P-type transistor and is turned on when the correction signal is at a low level. In this way, only one control line is used to connect the selection module 6 to the control module 3, so that ports of the control module 3 and a wiring space for transmission lines are saved, and the selection module 6 is simple in structure and is easy to manufacture.

In a second aspect, an embodiment of the present disclosure further provide a driving method for a phase shifter, including: generating a plurality of correction signals by a control module 3 according to phase shift degrees of a phase shift structure 1, respectively providing the correction signals at two terminals of a resistor sub-string 29 in a resistor string 24 of a digital-to-analog conversion module 2, calculating voltages of resistors 27 in the resistor sub-string 29, generating a driving signal according to voltages of the resistors 27, and driving the phase shift structure 1 by the driving signal to perform phase shifting.

Figure 10:
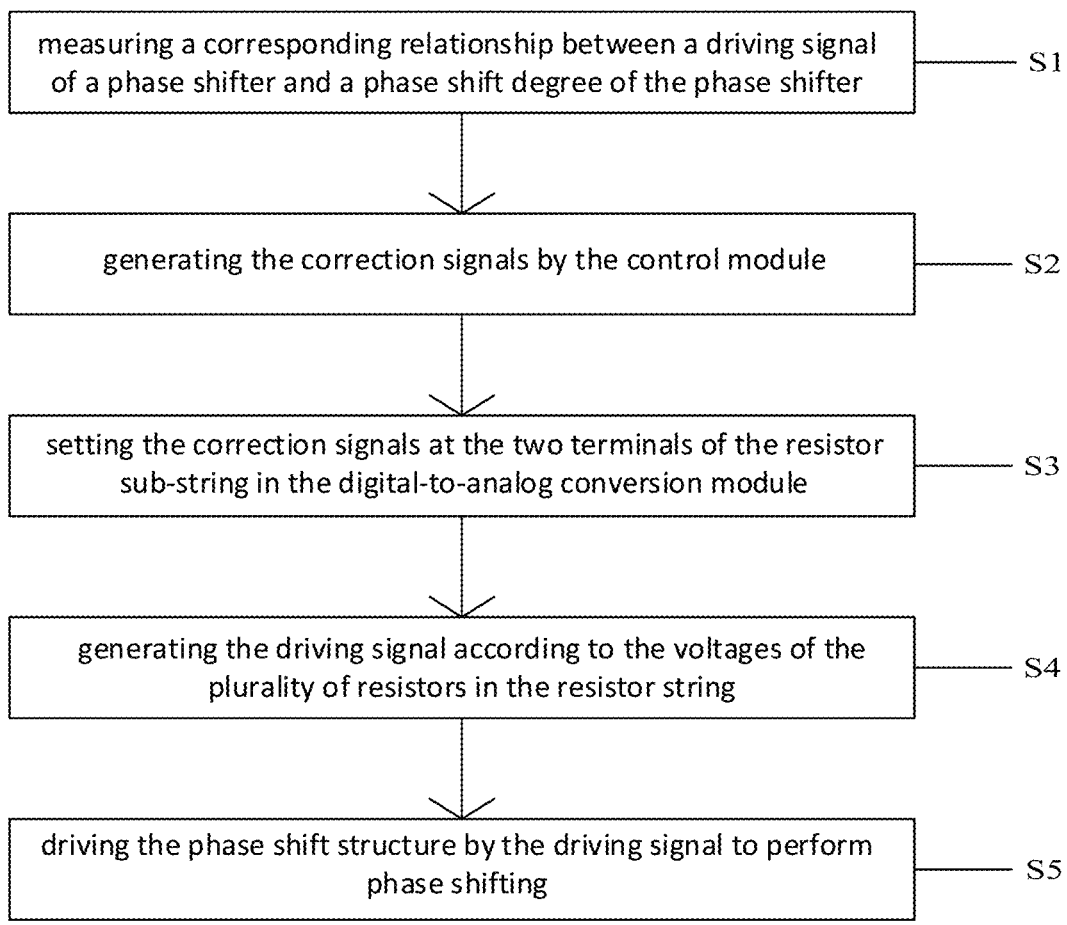
FIG. 10 is a schematic diagram illustrating a driving method according to the present disclosure.

Specifically, as shown in FIG. 10, the driving method for a phase shifter according to the embodiment of the present disclosure includes the following steps S1 to S5:

In step S1, a corresponding relationship between a driving signal of a phase shifter and a phase shift degree of the phase shifter is measured, where
    the phase shifter includes the digital-to-analog conversion module 2 and the phase shift structure 1, and a driving signal of the phase shift structure 1 and a phase shift degree of the phase shift structure 1 are measured with a vector network analyzer to obtain a corresponding relationship between the driving signal of the phase shift structure 1 and the phase shift degrees of the phase shift structure 1, and the corresponding relationship may be a comparison table of the driving signal and the phase shift degree, or a computable function expression, or the corresponding relationship curve 5. In such case, the corresponding relationship between the driving signal of the phase shift structure 1 and the phase shift degrees of the phase shift structure 1 is the corresponding relationship between the driving signal of the phase shifter and the phase shift degrees of the phase shifter.

In step S2, the control module 3 generates the correction signals, where
    an approximately linear correction curve in a certain range is calculated according to the corresponding relationship, some linear points are selected from the approximately linear curve, driving voltages of the linear points are used as anchor voltages, and the control module 3 takes the anchor voltages as the correction signals.

In step S3, the correction signals are provided at the two terminals of the resistor sub-string 29 in the digital-to-analog conversion module 2, where, a plurality of leads are disposed on connection lines between adjacent resistor sub-strings 29 and are connected to the control module 3, and the correction signals in the control module 3 are output to the two terminals of each resistor sub-string 29 through programming.

In step S4, the driving signal is generated according to the voltages of the plurality of resistors 27 in the resistor string 24, where a switch group 25 is connected to the resistor string 24, and one terminal of each switch 28 in the switch group 25 is connected to a connection line between two adjacent resistors 27, and the other terminal of each switch 28 in the switch group 25 is connected to the other switches 28. The on and off of the switches 28 in the switch group 25 are controlled by a data signal, and when one of the switches 28 is controlled by the data signal to be switched on, a sum of voltages of all the resistors 27 connected to the switch which is switched on is output as the driving signal.

In step S5, the driving signal drives the phase shift structure 1 to perform phase shifting, where the phase shift structure 1 is a liquid crystal phase shifter, and includes a reference electrode and a data electrode, which are disposed opposite to each other, the driving signal output by the switch group 25 is written to the data electrode, a dielectric constant of a liquid crystal layer 12 between the reference electrode and the data electrode is changed due to an electric field formed therebetween, and a phase of a microwave signal passing through the liquid crystal phase shifter is shifted due to a change of the driving signal in the liquid crystal layer 12.

In some implementations, the driving method further includes:

step S10, setting a resistance value of each resistor 27 according to the corresponding relationship.

Specifically, the corresponding relationship is the corresponding relationship between the driving signal of the phase shift structure 1 and the phase shift degrees of the phase shift structure 1, and is the corresponding relationship curve 5, an inverse slope of the corresponding relationship curve 5 is calculated, and the resistance value of each resistor 27 in the phase shifter is set according to the inverse slope of the corresponding relationship curve 5.

In this way, since the voltages of the resistors 27 in the phase shifter constitute the driving signal, the voltage at the resistor 27 having the resistance value calculated according to the inverse slope is equal to a slope of the inverse slope curve. Thus, the corresponding relationship between the driving signal of the phase shifter and the phase shift degree of the phase shifter can be corrected once in advance, thereby enhancing the controllability of the phase shift degree of the phase shifter.

In some implementations, the driving method further includes adjusting the correction signals according to the corresponding relationship. In the embodiment of the present disclosure, the correction signals are anchor signals, and the anchor voltages are selected mainly in view of a phenomenon of slop inconsistence due to an influence of a process of the liquid crystal phase shifter and an influence of a liquid crystal material. Since the phenomenon cannot be predicted in advance, the corresponding relationship curve 5 needs to be measured after the anchor voltages are set, and then the anchor voltages, i.e., the correction signals, are further adjusted according to the corresponding relationship curve 5.

Thus, driving for the phase shifter is completed. With the driving method, the driving signal output by a digital-to-analog conversion module in the phase shifter is adjusted by setting the anchor voltages, so that the phase shift degrees of the phase shifter is changed slowly with an increase of a driving voltage, thereby making the phase shift degrees of the phase shifter more controllable.

In a third aspect, an embodiment of the present disclosure further provide a driving method for a phase shifter, including: determining, by a logic control module 3 that a first data signal corresponding to a first phase shift degree of the phase shifter does not exist, and calculating a second phase shift degree which is different from the first phase shift degree by at least one phase shift period; generating a second data signal according to the second phase shift; generating a driving signal according to the second data signal; and driving the phase shift structure 1 by the driving signal to perform phase shifting.

Since the phase shifter in the embodiment of the present disclosure has a feature of periodic phase shifting, when the first data signal corresponding to the first phase shift degree of the phase shifter does not exist, the second data signal corresponding to the second phase shift degree which is different from the first phase shift degree by at least one phase shift period can be used to replace the first data signal to be output.

Figure 11:
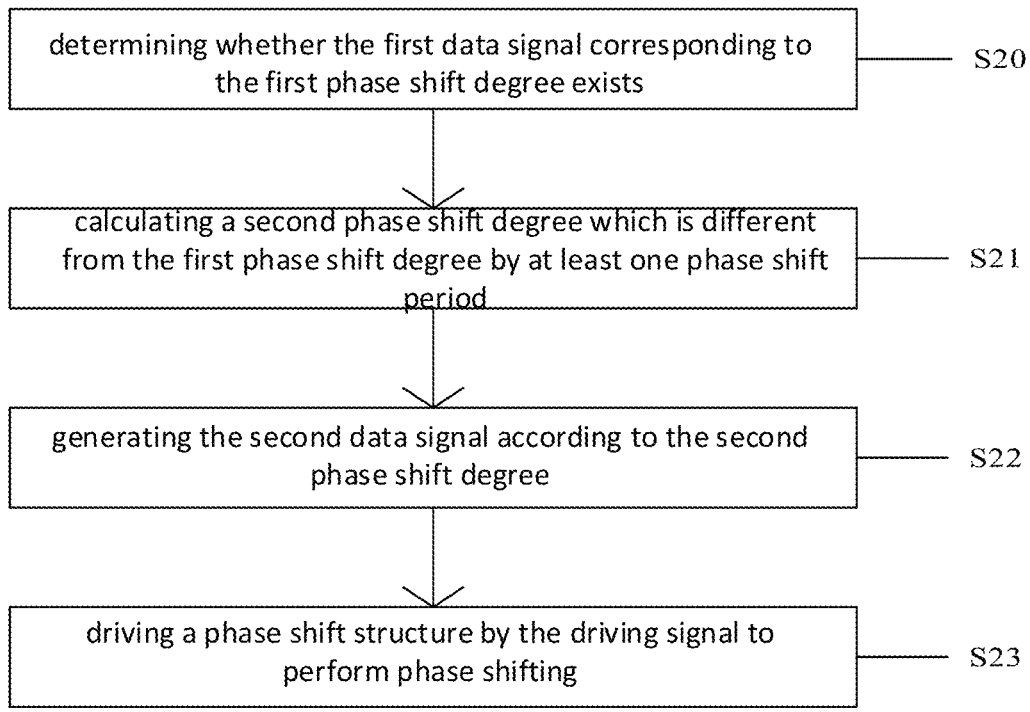
FIG. 11 is a schematic diagram illustrating another driving method according to the present disclosure.

Specifically, as shown in FIG. 11, the driving method for a phase shifter according to the embodiment of the present disclosure includes the following steps S20 to S23.

In step S20, a logic determination module determines whether the first data signal corresponding to the first phase shift degree exists.

specifically, the logic determination module stores a corresponding relationship between a driving signal of the phase shifter and the phase shift degrees of the phase shifter, calculates the first data signal corresponding to the first phase shift degree according to the corresponding relationship, and determines that the first data signal corresponding to the first phase shift degree does not exist if the first data signal cannot be calculated.

In step S21, the second phase shift degree which is different from the first phase shift degree by at least one phase shift period is calculated.

Specifically, a calculation module calculates the second phase shift degree which is different from the first phase shift degree by at least one phase shift period. Since the second phase shift degree being greater than the first phase shift degree by one phase shift period is preferable, the calculation module adds one phase shift period to the first phase shift degree to obtain the second phase shift degree.

In step S22, the second data signal is generated according to the second phase shift degree.

Specifically, a data generation module 4 also stores the correspondence relationship, calculates the second data signal corresponding to the second phase shift degree according to the second phase shift degree, and outputs the second data signal.

In step S23, the driving signal drives a phase shift structure 1 to perform phase shifting.

Specifically, the phase shift structure 1 is a liquid crystal phase shifter, and includes a reference electrode and a data electrode, which are disposed opposite to each other, the driving signal output by a switch group 25 is written to the data electrode, a dielectric constant of a liquid crystal layer 12 between the reference electrode and the data electrode is changed due to an electric field formed therebetween, and a phase of a microwave signal passing through the liquid crystal phase shifter is shifted due to a change of the driving signal in the liquid crystal layer 12.

In this way, in the embodiments of the present disclosure, on the basis of not changing an existing structure of the phase shifter, the phase shift characteristic of the phase shifter, is used, and the second data signal corresponding to the second phase shift degree with a larger driving voltage is output as the first data signal corresponding to the first phase shift degree because the controllability of a phase shift degree with a large driving voltage is better. Thus, the controllability of the phase shift degree of the phase shifter is enhanced.

In a fourth aspect, an embodiment of the present disclosure further provide a driving method for a phase shifter, including: generating a correction signal by a control module 3 according to magnitude of a driving signal, with a first driving signal being a driving signal output by a first digital-to-analog conversion submodule 21 in a digital-to-analog conversion module 2, and a second driving signal being a driving signal output by a second digital-to-analog conversion submodule 22 in the digital-to-analog conversion module 2; controlling, by a selection module 6, the first digital-to-analog conversion submodule 21 or the second digital-to-analog conversion submodule 22 to be turned on according to the correction signal to generate a driving signal; and driving the phase shift structure 1 by the driving signal to perform phase shifting.

Figure 12:
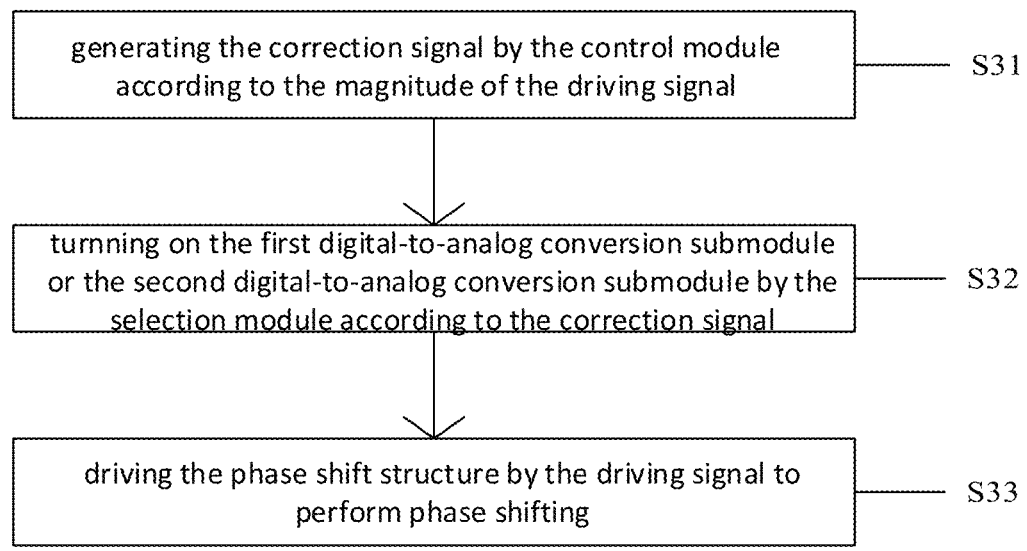
FIG. 12 is a schematic diagram illustrating still another driving method according to the present disclosure.

In the embodiment, different correction signals are set by comparing the magnitude of driving signals, so as to switch between the different digital-to-analog conversion submodules to output a corresponding driving signal. As shown in FIG. 12, the driving method includes the following specific steps S31 to S33.

In step S31, the control module 3 generates the correction signal according to the magnitude of the driving signal.

Specifically, the control module 3 judges the magnitude of a driving signal to be generated, and generates, if the magnitude of the driving signal is in a range of a first driving signal, a correction signal which enables the selection module 6 to select the first digital-to-analog conversion submodule 21 to output the driving signal, or generates, if the magnitude of the driving signal is in a range of a second driving signal, a correction signal which enables the selection module 6 to select the second digital-to-analog conversion submodule 22 to output the driving signal.

In step S32, the selection module 6 turns on the first digital-to-analog conversion submodule 21 or the second digital-to-analog conversion submodule 22 according to the correction signal.

Since resolution of the first digital-to-analog conversion submodule 21 is greater than that of the second digital-to-analog conversion submodule 22, a voltage of the first driving signal is less than that of the second driving signal. Stability of the phase shift degree is poor when the driving signal is in the range of the first driving signal, and the stability of the phase shift degree is better when the driving signal is in the range of the second driving signal. Therefore, when the magnitude of the driving signal is in the range of the first driving signal, the first digital-to-analog conversion submodule 21 with the higher resolution is selected to output the driving signal, so as to improve the stability of the phase shift degree in the range of the first driving signal. When the magnitude of the driving signal is in the range of the second driving signal, the second digital-to-analog conversion submodule 22 with the medium-low resolution is selected to output the driving signal, so as to solve a problem of a manufacturing cost of the phase shifter.

In step S33, the driving signal drives the phase shift structure 1 to perform phase shifting.

Specifically, the phase shift structure 1 is a liquid crystal phase shifter, and includes a reference electrode and a data electrode, which are disposed opposite to each other, the driving signal is written to the data electrode, a dielectric constant of a liquid crystal layer 12 between the reference electrode and the data electrode is changed due to an electric field formed therebetween, and a phase of a microwave signal passing through the liquid crystal phase shifter is shifted due to a change of the driving signal in the liquid crystal layer 12.

In this way, the digital-to-analog conversion submodules with different resolutions are selected according to the controllability of the phase shift degree for driving. On the one hand, a requirement of the resolution of the driving signal is met, on the other hand, a manufacturing cost is saved while the controllability of the phase shift degree of the phase shifter is enhanced.

Figure 13:
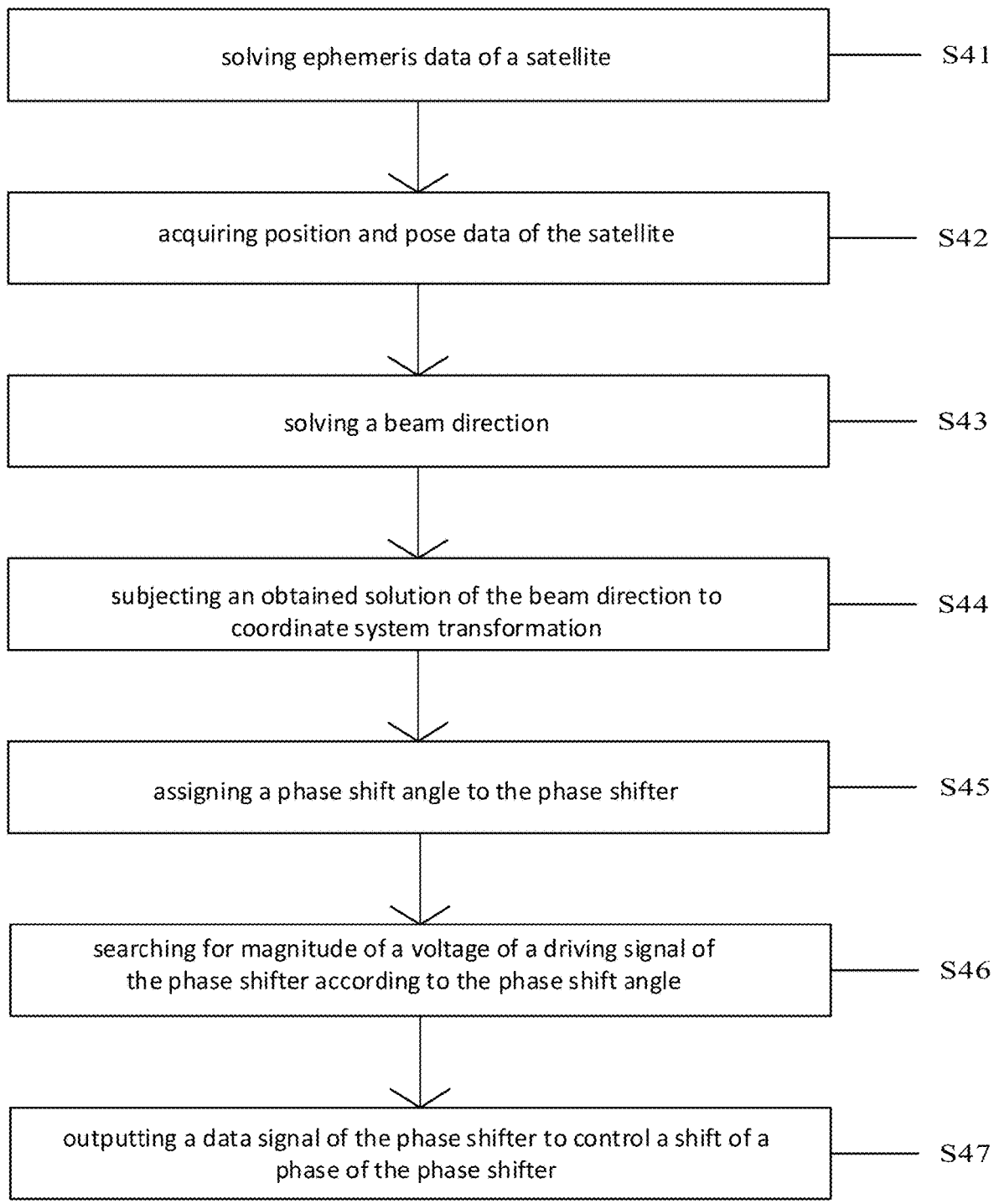
FIG. 13 is a schematic diagram illustrating an antenna system driving a phase shifter to shift a phase according to the present disclosure.

In a fifth aspect, the present disclosure further provides an antenna system, which includes the phase shifter according to the embodiments of the present disclosure. Specifically, the antenna system can be applied to a satellite. As shown in FIG. 13, specific operation steps of the phase shifter in the antenna system include:

step S41, solving ephemeris data of a satellite;

step S42, acquiring position and pose data of the satellite;

step S43, solving a beam direction;

step S44, subjecting an obtained solution of the beam direction to coordinate system transformation;

step S45, assigning a phase shift angle to the phase shifter;

step S46, searching for magnitude of a voltage of a driving signal of the phase shifter according to the phase shift angle; and step S47, outputting a data signal of the phase shifter to control a shift of a phase of the phase shifter.

Thus, the phase shifter in the antenna system completes phase shifting of a microwave signal in the antenna.

It should be understood that the above embodiments are merely exemplary embodiments adopted to illustrate the principle of the present disclosure, and the present disclosure is not limited thereto. Without departing from the spirit and essence of the present disclosure, those skilled in the art may make various modifications and improvements to the present disclosure, and those modifications and improvements should also be considered to fall within the scope of the present disclosure.

What is claimed is:

1. A phase shifter, comprising: a control module, a digital-to-analog conversion module and a phase shift structure, wherein
    the control module is configured to generate a plurality of correction signals according to phase shift degrees of the phase shift structure;
    the digital-to-analog conversion module is configured to generate a driving signal according to the correction signals;

the phase shift structure is configured to shift a phase of a microwave signal passing therethrough according to the driving signal, and a data generation module configured to generate a data signal according to status data of the phase shifter; the digital-to-analog conversion module comprises: a resistor string and a switch group; the resistor string is divided into a plurality of resistor sub-strings connected in series, and each resistor sub-string comprises a plurality of resistors connected in series; the switch group comprises a plurality of switches, and at least one resistor is connected between every two adjacent switches; and the switches are configured to electrically connect the resistor string to the phase shift structure, wherein a voltage across each resistor sub-string is set to be a voltage difference between different correction signals; and the driving signal is set to be a sum of voltages of the plurality of resistors; and the switches are configured to transmit the driving signal to the phase shift structure under control of the data signal.

2. The phase shifter of claim 1, wherein at least part of the resistors have different resistance values.

3. An antenna system, comprising the phase shifter of claim 2.

4. The phase shifter of claim 1, further comprising: an operational amplifier configured to amplify the driving signal and connected to the digital-to-analog conversion module and the phase shift structure.

5. An antenna system, comprising the phase shifter of claim 4.

6. The phase shifter of claim 1, further comprising a data generation module, a calculation module, a data conversion module and a logic control module; the logic control module is configured to generate a query signal when determining that a first data signal corresponding to a first phase shift degree of the phase shift structure does not exist; the calculation module is configured to generate a second phase shift degree which is different from the first phase shift degree by at least one phase shift period according to the query signal; the data generation module is configured to generate a second data signal according to the second phase shift degree; and the data conversion module is configured to generate the driving signal according to the second data signal.

7. The phase shifter of claim 6, wherein the second phase shift degree is greater than the first phase shift degree, and the second phase shift degree is different from the first phase shift degree by one phase shift period.

8. The phase shifter of claim 1, further comprising a selection module; the digital-to-analog conversion module comprises a first digital-to-analog conversion submodule and a second digital-to-analog conversion submodule; a first driving signal output by the first digital-to-analog conversion submodule is less than a second driving signal output by the second digital-to-analog conversion submodule in magnitude; and resolution of the first driving signal is greater than that of the second driving signal;

the control module is configured to generate the correction signals according to magnitudes of the driving signals; and the selection module is configured to turn on the first digital-to-analog conversion submodule or the second digital-to-analog conversion submodule according to the correction signals.

9. The phase shifter of claim 8, wherein the selection module comprises a first transistor and a second transistor; a control electrode of the first transistor is connected to the control module, a first electrode of the first transistor is connected to the first digital-to-analog conversion submodule, and a second electrode of the first transistor is connected to the phase shift structure; and a control electrode of the second transistor is connected to the control module, a first electrode of the second transistor is connected to the second digital-to-analog conversion submodule, and a second electrode of the second transistor is connected to the phase shift structure.

10. The phase shifter of claim 8, wherein the selection module comprises a first transistor and a second transistor; and switching characteristics of the first transistor and the second transistor are opposite; and a control electrode of the first transistor and a control electrode of the second transistor are connected to each other, and are connected to the control module; a first electrode of the first transistor is connected to the first digital-to-analog conversion submodule, and a second electrode of the second transistor is connected to the second digital-to-analog conversion submodule; and a second electrode of the first transistor and a first electrode of the second transistor are connected to each other, and are connected to the phase shift structure.

11. An antenna system, comprising the phase shifter of claim 6.

12. The phase shifter of claim 1, wherein the control module comprises: one of a Microcontroller Unit, a Digital Signal Processor, an Application Specific Integrated Circuit, or a Field Programmable Gate Array.

13. An antenna system, comprising the phase shifter of claim 1.

14. A driving method for the phase shifter of claim 1, comprising: generating a plurality of correction signals by the control module according to phase shift degrees of the phase shift structure; respectively setting the correction signals at two terminals of a resistor sub-string in a resistor string of the digital-to-analog conversion module; generating a driving signal according to voltages of a plurality of resistors in the resistor string; and driving the phase shift structure by the driving signal to perform phase shifting.

15. The driving method for the phase shifter of claim 14, further comprising: before respectively setting the correction signals at the two terminals of the resistor sub-string in the resistor string of the digital-to-analog conversion module, calculating a corresponding relationship between a driving signal of the phase shift structure and phase shift degrees of the phase shift structure; and setting a resistance value of each resistor according to the corresponding relationship.

16. The driving method for the phase shifter of claim 15, further comprising: adjusting the correction signals according to the corresponding relationship.

17. A driving method for a phase shifter, comprising: determining by a logic control module that a first data signal corresponding to a first phase shift degree of the phase shifter does not exist; calculating a second phase shift degree which is different from the first phase shift degree by at least one phase shift period; generating a second data signal according to the second phase shift; generating a driving signal according to the second data signal; and driving a phase shift structure by the driving signal to perform phase shifting.

18. A driving method for a phase shifter, comprising: generating a correction signal by a control module according to magnitude of a driving signal; wherein the driving signal comprises a first driving signal and a second driving signal, the first driving signal is a driving signal output by a first digital-to-analog conversion submodule in a digital-to-analog conversion module, and the second driving signal is a driving signal output by a second digital-to-analog conversion submodule in the digital-to-analog conversion module; and controlling, by a selection module, the first digital-to-analog conversion submodule or the second digital-to-analog conversion submodule to be turned on according to the correction signal to generate a driving signal; and driving a phase shift structure by the driving signal to perform phase shifting.

\* \* \* \* \*